United States Patent [19]

Nanzai

[11] Patent Number: 4,801,876
[45] Date of Patent: Jan. 31, 1989

[54] PRINTED WIRING BOARD TESTER

[75] Inventor: Takashi Nanzai, Fujisawa, Japan

[73] Assignee: Sagami Tsushin Kogyo Kabushiki Kaisha, Chigasaki, Japan

[21] Appl. No.: 37,004

[22] Filed: Apr. 10, 1987

[30] Foreign Application Priority Data

Apr. 18, 1986 [JP] Japan ................................ 61-90949
Dec. 26, 1986 [JP] Japan ............................... 61-200033

[51] Int. Cl.⁴ ...................... G01R 1/067; G01R 1/04
[52] U.S. Cl. ........................... 324/158 F; 324/73 PC; 324/158 P
[58] Field of Search ............... 324/158 P, 158 F, 149, 324/72.5, 73 PC; 439/219, 42

[56] References Cited

U.S. PATENT DOCUMENTS

| | | | |
|---|---|---|---|
| 3,676,776 | 7/1972 | Bauer et al. ...................... | 324/158 P |
| 4,050,762 | 9/1977 | Hines et al. ........................ | 324/72.5 |
| 4,138,643 | 2/1979 | Beck et al. ........................ | 324/158 P |
| 4,200,351 | 4/1980 | Long et al. | |
| 4,321,532 | 3/1982 | Luna .................................. | 324/158 F |
| 4,357,062 | 11/1982 | Everett ............................. | 324/158 F |
| 4,658,212 | 4/1987 | Ozawa et al. ..................... | 324/158 P |
| 4,659,987 | 4/1987 | Col et al. .......................... | 324/72.5 |

FOREIGN PATENT DOCUMENTS

| | | | |
|---|---|---|---|
| 3136896 | 4/1983 | Fed. Rep. of Germany . | |
| 0158357 | 8/1985 | Japan ................................ | 324/158 P |
| 0190876 | 9/1985 | Japan ................................ | 324/158 P |
| 2145582 | 3/1985 | United Kingdom ............. | 324/158 P |

OTHER PUBLICATIONS

"Tester contact Method", by Kappel et al., IBM Tech. Disc. Bull., vol. 21, #9, 2/79, p. 3742.

European Search Report, EP87 303409; 6/30/87.

Primary Examiner—Reinhard J. Eisenzopf
Assistant Examiner—W. Burns
Attorney, Agent, or Firm—Birch, Stewart, Kolasch & Birch

[57] ABSTRACT

A printed wiring board tester which comprises first and second fixture members disposed in spaced-apart, substantially parallel relationship with respect to each other, a plurality of probe pins disposed between the first and second fixture members, and slidably extending therethrough, the probe pins comprising a first pin element having a large diameter section connected with a small diameter section by a stepped portion, the larger diameter section having a free end which is provided for engagement with the terminal area of a printed wiring board to be tested, a cylindrical second pin element divided into large and small diameter sections, the larger diameter section slidably fitting over the small diameter section of the first pin element with the end thereof defining a stopper jaw which engages the stopped portion, and a cord connecting element extending into and connected to the small diameter section of the second pin element, and a third pin element comprising a coiled spring member which is loosely fitted around the periphery of the second pin portion and disposed between said first and second fixture members, one end of the spring member engaging the stopper jaw of the second pin element and the other end thereof engaging the fixture member, said coiled spring member imparting a bias to the first pin element to ensure that it is in positive contact with the terminal area of the printed wiring board.

4 Claims, 3 Drawing Sheets

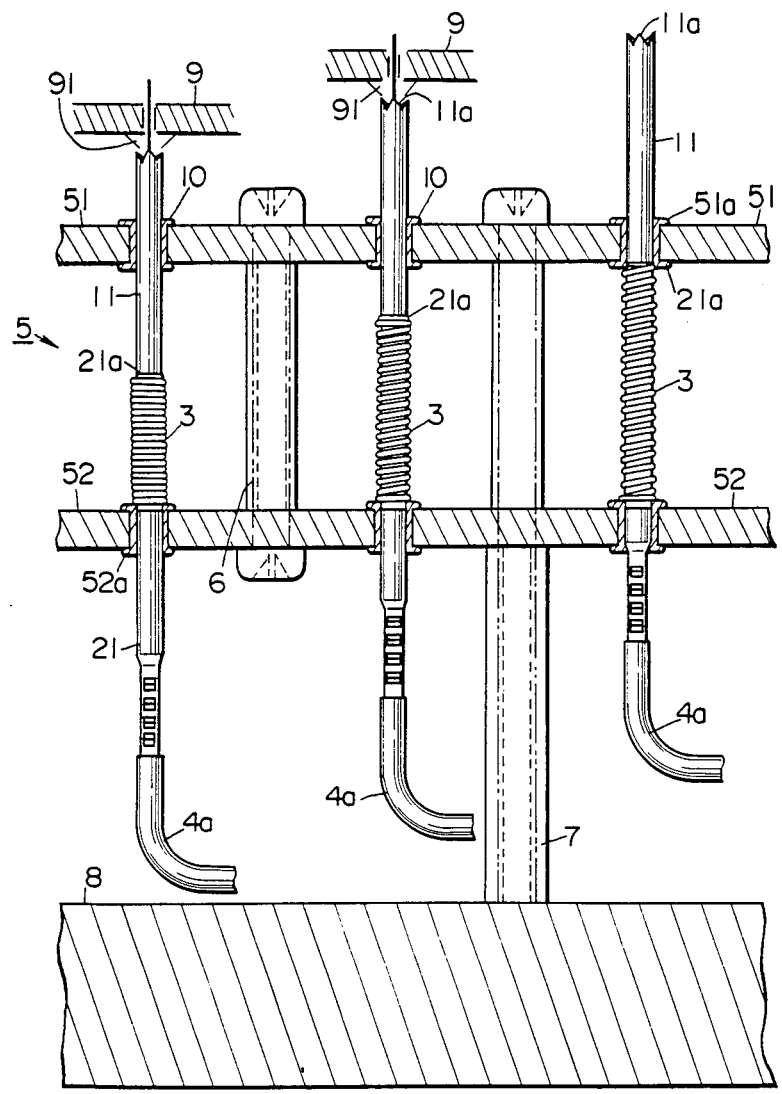

PRINTED WIRING BOARD TESTER

BACKGROUND OF THE INVENTION

The present invention relates to a printed wiring board tester. More particularly, it relates to improvements in a probe pin adapted to be used in a printed wiring board tester and a printed wiring board which uses an improved probe pin.

As known, the printed wiring board tester examines mutual relationship in electric connection between any two points in terminal areas on individual printed wiring boards. That is, it examines whether two points in terminal areas are in a conductive state or not, and therefore functions to distinguish any improper electric connection from a proper electric connection.

In the meantime, a printed pattern formed on a printed wiring board to be examined or tested, or the disposition of groups of terminal areas varies since standardization of its lattice spacing is not sized and thus printed wiring boards are embodied with various kinds of spacing values. Furthermore, even one kind of or the same size of printed wiring boards have various lattice pitchs. Therefore, in principle, a fixture of exclusive use is required at every printed wiring board to be examined.

Conventionally, in order to avoid the abovementioned disadvantages, the tester which is provided with, for example, 0.1 inches (2.54 mm) lattice spacing as a standard is used and adaptors which are prepared for every kind of printed wiring board to be examined are selectively replaced, to be used for corresponding printed wiring boards, thereby testing various kinds of printed wiring boards.

However, since, in the above-mentioned adaptor, the probe pins are indirectly engaged with the terminal areas of the printed wiring board through adaptor pins, poor contact sometimes occurs, and in addition, the user's operation of the tester is not good, resulting in increased time and labour required for testing and preparation of testing.

First of all, the inventor has been investigating the simplification of construction from the points of view that in the case where a fixture of exclusive use examines the board without using the above-mentioned adaptor, good and high reliability of results are obtained, and very high costs are incurred for the manufacturing of individual fixtures of exclusive use since probe pins used in fixtures of exclusive use are complicated in their construction.

Although there have been various kinds of spring probes, it is common knowledge that every spring probe is fundamentally composed of four members, that is, a probe body provided with its head engaging with terminal areas, a coiled spring engaged with the probe body, a first case member telescopically holding the probe body through the coiled spring, and a second member connected at its one end with a lead and removably inserted in the first case member. Consequently, a conventional probe pin has many components and a conventional printed wiring board tester which uses these many components involves high costs in manufacturing. Further, the probe pin itself is complicated, as mentioned above, and a very small coiled spring a spring as well as functions as a portion of an electric circuit by being inserted into the first case and engaged with the lower end of the probe body. This results in many problems and a consumption in the time required for manufacturing. Since printed wiring boards have recently become miniaturized rapidly and the lattice spacings of the through-holes become the smaller due to the development of high density, it is clear that the above-mentioned disadvantages are liable to increase.

Consequently, with the above-mentioned construction of the conventional probe pin, a printed wiring board tester which fulfils pneumatic and mechanical functions of high reliability will not be expected.

SUMMARY OF THE INVENTION

The present invention is attained in order to overcome the above-mentioned disadvantages, and thus an object of the present invention is to provide a novel probe pin which is very simple in construction and can be assembled easily, and also to provide a printed wiring board tester which utilizes probe pins of such a construction.

It is another object of the present invention to provide a novel probe pin in which the spring force of a coiled spring constituting a portion of the probe pin is utilized without forming a portion of the electric circuit so that the probe pin is not affected by a variable contact resistance due to the movement of the coiled spring, the present invention also provides a printed wiring board tester which utilizes probe pins of such a construction.

The above-mentioned objects are accomplished by a printed wiring tester which comprises; probe pins, each probe pin comprising a first pin element including a greater diameter section having one end provided with a contact portion engaged with the terminal area of a printed wiring board to be tested and having the other end formed with a stepped portion and a smaller diameter section integral with the greater diameter section through the stepped portion, a second pin element having at its one end a cylindrical portion fitted on said smaller diameter section of said first pin element and having a cord connecting portion at the other end with said cylindrical portion being formed at its inlet end with a stopper jaw and said cylindrical portion including said stopper jaw being formed with the slit in a longitudinal direction, and a third pin element made of a coiled spring having one end engaged with said stopper jaw of said second pin element and loosely fitted on the peripheral portion of said second pin element, and first and second fixture members disposed spaced from each other at a distance and in parallel with each other, a plurality of said probe pins being movably disposed and extending through said first and second fixture members so that said third pin element is located between said first and second fixture members.

The present invention has many features as follows;

Firstly, the probe pin according to the present invention comprises first, a second and third pin elements, and therefore the number of its part is less than that of the conventional elements. In addition, each of these elements is of such a simple construction that it is easily manufactured, which reduces the cost of manufacturing.

Secondly, since the conventional probe pin uses a coiled spring as a portion of the electric circuit, the opposite ends of the spring function as movable contact portions, resulting in an increased resistance as well as variation. On the other hand, since, in the present invention, the coiled spring is used merely for its spring force without using it as a portion of an electric circuit, it is not necessary at all to consider its contact resistance and variations during operation.

Thirdly, since, in the present invention, the coiled spring is loosely fitted on the peripheral portion of the probe pin body (the second pin element), a coiled spring of greater diameter can be formed, thereby increasing reliability of operation of the probe. In addition, the manufacturing, working, and assembling of the device are made easy. In particular, since the diameter of the probe pin itself must become small in response to the fact that the lattice spacings of the probe pin has recently become smaller and smaller, the conventional types of probe pins where the coiled spring is mounted in the pipe, as mentioned above, cannot deal with the above-mentioned demands. As a result, it is clear that the device according to the present invention will answer the expectations and demands of the industry.

Fourthly, since the three elements according to the present invention are simple in construction and assembly in a proper manner as mentioned above, no problems will occur at all and thus a long life will be expected.

Fifthly, since in the present invention, the second pin element is formed with a slit, the first and second elements are rigidly connected with each other due to the resiliancy of the second pin element, and its contact resistance can be made small.

Sixthly, in case where the probe pins are assembled in the fixtures, since the coiled spring of the third pin element in various kinds of forces can be prepared, and therefore can be selectively used, a constant spring force can be easily imparted to all the probe pins.

Seventhly, since the probe pin according to the present invention can be mounted to fixtures through bearings, the wear of the fixture and the probe pin can be reduced and at the same time occurrance of static electricity can be suppressed or eliminated, thereby easily obtaining a printed wiring board tester of high reliability.

BRIEF DESCRIPTION OF THE DRAWINGS

The present invention will be now described in detail with reference to the preferred embodiments illustrated in the accompanying drawings in which:

FIG. 6 is a cross-sectional view of a main portion of the printed wiring board tester which utilizes the probe pin according to the present invention.

DESCRIPTION OF THE PREFERRED EMBODIMENTS

Figure 1:
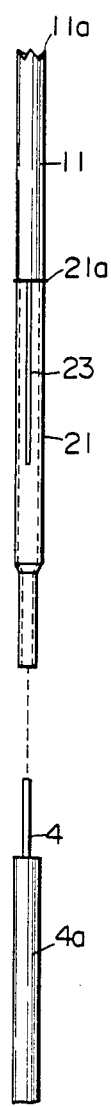
FIG. 1 is a front view of the first embodiment according to the present invention with the coiled spring being removed.
Figure 2:
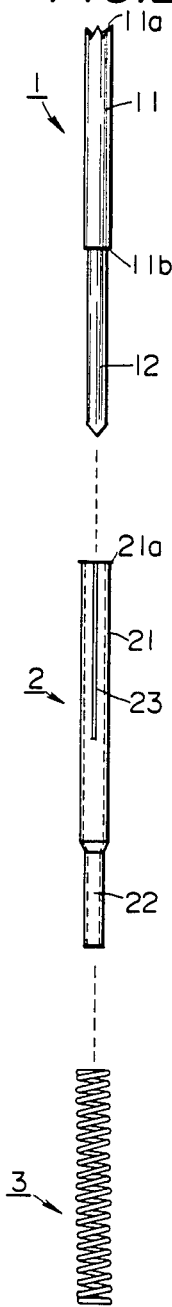
FIG. 2 is an exploded front view of the first embodiment.
Figure 3:
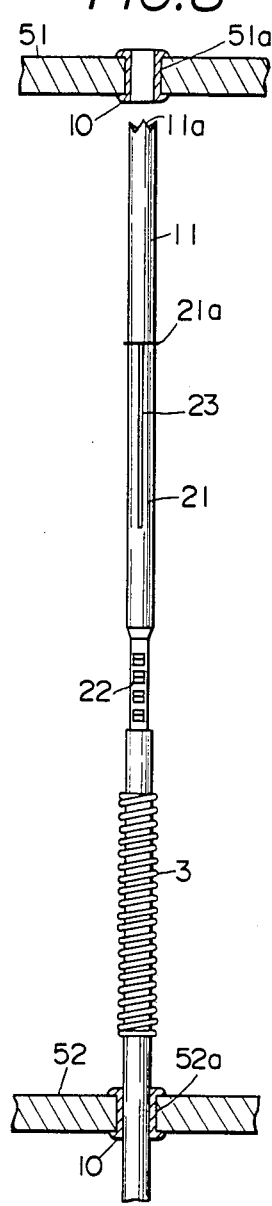
FIG. 3 is a front view for explaining operation of mounting the probe pin of the first embodiment on the fixtures.

Other features and advantages of the invention will be apparent from the following description taken in connection with the accompanying drawings wherein:

Referring first to FIGS. 1 to 3, reference numerals 1, 2 and 3 designate a first, a second, and a third pin elements, respectively. A probe pin for a printed wiring board tester of a first embodiment according to the present invention comprises only the first pin element 1, the second pin element 2 and the third pin element 3.

The first pin element 1 comprises a greater diameter (cylinder) section 11 which has one end provided with a contact portion 11a engaged with the terminal area of the board to be tested or examined and the other formed as a stepped portion 11b, and a smaller diameter (cylinder) section 12 integral with the greater diameter portion 11 through the stepped portion 11b.

The second pin element 2 comprises a greater diameter (hollow cylinder) portion 21 into which the smaller diamiter portion 12 of the first pin element 1 fits, and a cord connecting portion (smaller cylinder portion) 22, to which a cord 4 is crimped. The greater diameter portion 21 is formed at its end with a stopper jaw 21a which engages with the stepped portion 11b of the first pin element 1 and with one end of the third pin element 3. The stopper jaw 21a is engaged with the lower portion of the bearing of a member 51 when the probe pin is inserted in a bearing 10 provided in a through-hole 51 of a fixture member 51 and therefore also functions as a stopper for preventing the probe pin from its further upward movement (see FIG. 3). The cylinder portion 21 is longitudinally formed with a slit 23.

The third pin element 3 comprises a coiled spring which is loosely fitted into the outer peripheral portion of cylinder portion 21 of the second pin element 2. To this end, various kinds of coiled springs which have different spring forces can be utilized.

The above constructed probe pin is mounted on the fixtures of the printed wiring board tester, as shown in FIG. 6. More particularly, first, the smaller cylinder portion 12 of the first pin element 1 is rigidly inserted into the greater cylinder portion 21 of the second pin element 2. Then, the cord 4 is inserted and crimped in the cord connecting portion 22 of the second pin element 2 and the coiled spring of the third element 3 is loosely fitted onto the cylinder portion 21 of the second pin element, or after the coiled spring is loosely fitted onto the cylinder portion 21, the cord 4 is connected to the connecting portion 22. Thus, the probe pin is assembled. Then the assembled prove pin is inserted for vertical movement in the bearings 10, respectively, which are provided with through-holes 51a, 52a provided on the fixture members 51, 52 in a lattice pattern.

In FIG. 6 which is a partial cross-sectional view showing an example of a fixture adopting the probe pin according to the present invention, a reference numeral 5 designates a fixture comprises the fixture members 51, 52. Reference numeral 6 designates a spacer which determines a distance between the fixture members 51 and 52. A reference numeral 7 designates a spacer and stud for attaching the fixture 5 to a base 8. Reference numeral 9 designates a board to be examined. "A" shows that the probe pin is in a stationary or normal state in which the coiled spring or the third pin element 3 extends between the fixture members 51 and 52. "B" and "C" show that the mounted board 9 to be examined is disposed above the fixture 5, the terminal area 91 of the board 9 is engaged with the connecting portion 11a of the probe pin, and the probe pin is pushed upward for examination. As shown, the coiled spring is compressed between the stopper jaw 21a and the fixture member 52, and therefore the resiliancy of the coiled spring 3 pushes the pin upward, resulting in pressure engagement of the connecting portion 11a to the terminal area 91.

Although the first pin element is required to be replaced with another new one due to the wear of the connecting portion 11a of the first pin element, since the first pin element 1 is removably fitted in the second pin element 2, the first and second pin elements 1 and 2 can be easily separated from each other and thus the first pin element is easily replaceable. On the other hand, since the first and second pin elements are moved toward each other by the action of the spring force, both the pin elements are not easily separated during examination.

Figure 4:
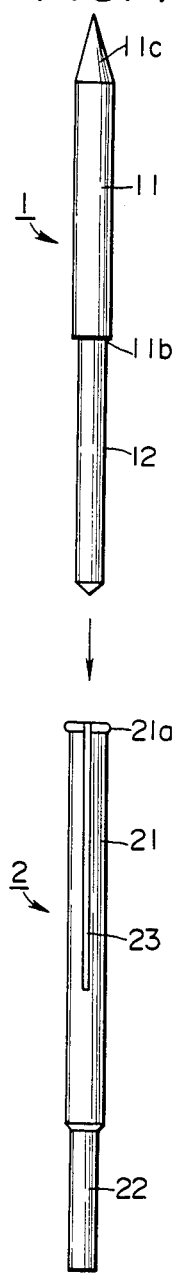
FIG. 4 is a front view of the second embodiment with the first and second pin elements being separated and the third pin element being removed.
Figure 5:
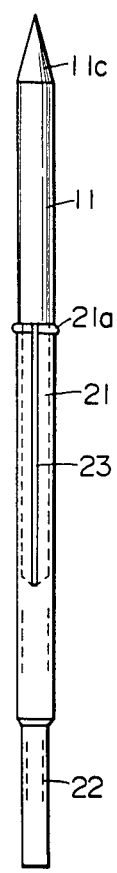
FIG. 5 is a front view of the connected first and second pin elements with the third pin element being removed.

FIGS. 4 and 5 show a second embodiment according to the present invention. Although the first embodiment is directed to examination on a mounted board, the second embodiment is directed to a board in which electric elements are not mounted. That is, in the second embodiment, the first pin element which has its end formed with a conical-shaped connecting portion 11c is used instead of the first pin element with the connecting portion 11a. Furthermore, since other elements are the same as in a case of the first embodiment, the detailed explanation thereof is not necessary.

What is claimed is:

1. A printed wiring board tester which comprises
   first and second fixture members disposed in spaced-apart, substantially parallel relationship with respect to each other,
   a plurality of probe pins disposed between said first and second fixture members, and slidably extending therethrough,
   said probe pins comprising a first pin element having a large diameter section connected with a small diameter section by a stepped portion, said large diameter section having a free end which is provided for engagement with the terminal area of a printed wiring board to be tested,
   a cylindrical second pin element divided into large and small diameter sections, said large diameter section slidably fitting over the small diameter section of the first pin element with the end thereof defining a stopper jaw which engages said stepped portion, and a cord connecting element extending into and connected to the small diameter section of said second pin element, and
   a third pin element comprising a coiled spring member which is loosely fitted around the periphery of said second pin portion and disposed between said first and second fixture members, one end of said spring member engaging the stopper jaw of said second pin element and the other end thereof engaging said fixture member, said coiled spring member imparting a bias to the first pin element to ensure that it is in positive contact with the terminal area of the printed wiring board.

2. The printed wiring board tester according to claim 1 wherein said cylindrical portion of said second pin element including said stopper jaw is provided with a slit extending in a longitudinal direction.

3. The printed wiring board tester according to claim 1 wherein the large diameter section of said first pin element and said cylinder portion of said second pin element extend through bearings provided in said fixture members.

4. The printed wiring board tester according to claim 1 wherein said cord connecting portion of said second pin element is connected to a larger diameter portion thereof.

* * * * *